United States Patent
Sugiura

(10) Patent No.: US 8,143,888 B2
(45) Date of Patent: Mar. 27, 2012

(54) MAGNETIC RESONANCE IMAGING APPARATUS AND METHOD

(75) Inventor: Satoshi Sugiura, Otawara (JP)

(73) Assignees: Kabushiki Kaisha Toshiba, Tokyo (JP); Toshiba Medical Systems Corporation, Tochigi (JP)

(*) Notice: Subject to any disclaimer, the term of this patent is extended or adjusted under 35 U.S.C. 154(b) by 126 days.

(21) Appl. No.: 12/458,003

(22) Filed: Jun. 29, 2009

(65) Prior Publication Data

US 2010/0026295 A1 Feb. 4, 2010

Related U.S. Application Data

(62) Division of application No. 11/648,542, filed on Jan. 3, 2007, now Pat. No. 7,570,050.

(30) Foreign Application Priority Data

Jan. 11, 2006 (JP) .................................. 2006-004019

(51) Int. Cl.
*G01V 3/00* (2006.01)
(52) U.S. Cl. ....................................................... 324/307
(58) Field of Classification Search ........... 324/300–322
See application file for complete search history.

(56) References Cited

U.S. PATENT DOCUMENTS

| 5,800,354 | A  | * | 9/1998  | Hofland et al. ............... 600/410 |
| 6,725,078 | B2 | * | 4/2004  | Bucholz et al. ............... 600/410 |
| 6,822,447 | B1 |   | 11/2004 | Yamagata |
| 7,034,535 | B2 |   | 4/2006  | Yamagata |
| 7,307,423 | B2 |   | 12/2007 | Ehman et al. |
| 7,319,325 | B2 |   | 1/2008  | Petot et al. |
| 7,324,626 | B2 |   | 1/2008  | Vilsmeier et al. |
| 7,486,076 | B2 | * | 2/2009  | Nagao et al. ................... 324/318 |
| 7,570,050 | B2 | * | 8/2009  | Sugiura ......................... 324/307 |
| 7,672,429 | B2 | * | 3/2010  | Urano et al. .................... 378/65 |

FOREIGN PATENT DOCUMENTS

| CN | 1643393     | 7/2005 |
| JP | 6-66630     | 9/1994 |
| JP | 10-234697   | 9/1998 |
| JP | 2004-202043 | 7/2004 |
| WO | 2004/080301 | 9/2004 |

OTHER PUBLICATIONS

Wang et al; "Navigator-Echo-based Real-Time Respiratory Gating and Triggering for Reduction of Respiration Effects in Three-dimensional Coronary MR Angiography", Radiology, Jan. 1996, vol. 198, pp. 55-60.
Weber et al; "Whole-Heart Steady-State Free Precession Coronary Artery Magnetic Resonance Angiography", Magnetic Resonance in Medicine, vol. 50, pp. 1223-1228, 2003.
Office Action dated Jun. 6, 2008 filed in corresponding Chinese Application No. 2007100016796 including English translation.
Office Action issued in related Japanese Appln. No. 2006-004019 (Apr. 5, 2011) w/English translation.

* cited by examiner

*Primary Examiner* — Dixomara Vargas
(74) *Attorney, Agent, or Firm* — Nixon & Vanderhye PC

(57) ABSTRACT

A magnetic resonance imaging apparatus includes a movement unit which moves a subject placed in a static magnetic field, a collector which collects data corresponding to a magnetic resonance signal emitted from the subject, a detector which detects a position of a particular section of the subject in the static magnetic field, a reconstruction unit which reconstructs an image, based on the collected data, when the detected position falls within an allowable area, and a controller which controls the movement unit to compensate for a deviation of the detected position from a reference position.

7 Claims, 6 Drawing Sheets

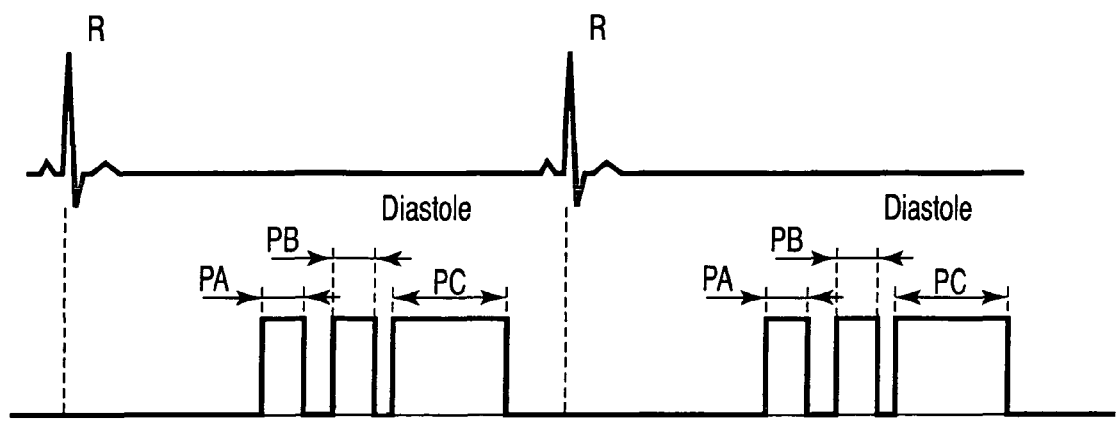
F I G. 2
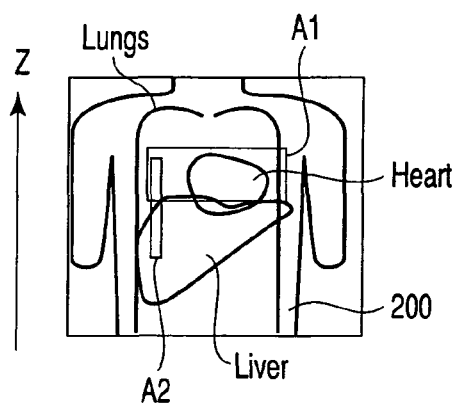
F I G. 3

MAGNETIC RESONANCE IMAGING APPARATUS AND METHOD

CROSS-REFERENCE TO RELATED APPLICATIONS

This application is a divisional application of U.S. application Ser. No. 11/648,542, filed Jan. 3, 2007, now U.S. Pat. No. 7,570,050, which is based upon and claims the benefit of priority from prior Japanese Patent Application No. 2006-004019, filed Jan. 11, 2006, the entire contents of each of which are incorporated herein by reference.

BACKGROUND OF THE INVENTION

1. Field of the Invention

The present invention relates to a magnetic resonance imaging (MRI) apparatus and method for performing image reconstruction, using data collected when a body portion, such as the diaphragm, is positioned in a preset allowable area.

2. Description of the Related Art

The heart, for example, moves in accordance with, for example, breathing. As an imaging method employed to perform imaging of such a moving target section, there is a known movement compensation method in which data collected when the target section is positioned within a preset allowable area is utilized for reconstructing the target section. In the movement compensation method, a magnetic resonance signal (navigator echo signal) that reflects movement of the target section is acquired from an imaging subject to detect the position of the target section.

However, when the movement compensation method is employed, not all data collected can be utilized for reconstruction, and the required imaging time is lengthened. For instance, in the case where the number of imaging slices is 70, the number of lines in the direction of phase encoding is 128, and data corresponding to 8960 lines (=70×128) is needed. Assuming that data corresponding to 20 lines can be acquired by data collection during the period of one heartbeat, the period corresponding to 448 heartbeats (=8960/20) are required to collect data corresponding to 8969 lines. If one heartbeat requires one second, the necessary minimum imaging period is 448 seconds=about 7.5 min. However, if the probability of employment of data during the above compensation operation is 50%, the actually required imaging period is about 15 min., that is twice the minimum imaging period.

When the imaging period is long, the state of breathing of a subject, i.e., the depth of breathing, may change during imaging. The depth of breathing changes when, for example, a subject falls asleep. In this case, the position of a target section is greatly changed, and may fall outside an allowable area for a long time. This further reduces the probability of employment of collected data for reconstruction, which further lengthens the required imaging period. At worst, the target section may always fall outside the allowable area. In this case, reconstruction cannot be realized, and hence the imaging operation cannot be finished.

To avoid this, a method for correcting a positional allowable area to increase data collection efficiency has been proposed (see, for example, Jpn. Pat. Appln. KOKAI Publication No. 2004-202043).

In this method, however, data concerning different sections of the target section is collected before and after the correction of the allowable area, since the region, in which data is actually collected, is not spatially moved. FIG. 10 shows a state in which the position of a target section relative to a slicing position is changed before and after the correction of the allowable area. Since reconstruction is performed using the data thus collected, the resultant image is blurred by the influence of the movement of the target section, regardless of compensation.

There is a method for dealing with such a disadvantage. In this method, the position of slicing is moved in accordance with the movement of a target section. By combining this method and the above-described allowable area correcting method, the relationship between the slicing position and the position of the target section can be maintained substantially constant. However, in this case, the slicing position is greatly moved in the Z-axis direction as shown in FIG. 11.

In heart imaging, in particular, in coronary artery imaging, it is essential to suppress the occurrence of signals from fat tissue around the arteries to enhance the contrast. Suppression of fat tissue signal levels is indispensable. Further, in general, a pulse sequence using steady state free precession (SSFP) that provides excellent contrast of heart muscle and blood is utilized as an imaging sequence. It is well known that this pulse sequence is very sensitive to static magnetic field uniformity. There is another imaging method, such as an echo planar imaging (EPI), in which the static magnetic field uniformity of an imaging section significantly influences the quality of the resultant image.

In the above-described movement compensation method, however, the slicing position is moved in the static magnetic field during imaging, which means that the slicing position cannot be kept at a position at which the static magnetic field is uniform. Accordingly, if the imaging method sensitive to static magnetic field uniformity is combined with the above-mentioned movement compensation method, the degree of suppression of the occurrence of fat tissue signals may be reduced, and a reduction in image quality, such as an increase in banding artifacts in the SSFP method, may be involved.

BRIEF SUMMARY OF THE INVENTION

Under the above circumstances, there is a demand for high-quality imaging performed by an imaging method sensitive to static magnetic field uniformity, with the relationship between the sliding position and the position of a target section kept substantially constant.

According to a first aspect of the present invention, there is provided a magnetic resonance imaging apparatus comprising: a movement unit which moves a subject placed in a static magnetic field; a collector which collects data corresponding to a magnetic resonance signal emitted from the subject; a detector which detects a position of a particular section of the subject in the static magnetic field; a reconstruction unit which reconstructs an image, based on the collected data, when the detected position falls within an allowable area; and a controller which controls the movement unit to compensate for a deviation of the detected position from a reference position.

According to a second aspect of the present invention, there is provided a magnetic resonance imaging apparatus comprising: a collector which collects data corresponding to a magnetic resonance signal emitted from a subject placed in a static magnetic field; a detector which detects a position of a particular section of the subject in the static magnetic field; a setting unit which sets an allowable area in accordance with a range of variations in the position detected by the detector within a unit period; and a reconstruction unit which reconstructs an image based on the collected data, if the collected data is collected when the detected position falls within the allowable area.

According to a third aspect of the present invention, there is provided a magnetic resonance imaging method for use in a magnetic resonance imaging apparatus with a movement unit for moving a subject placed in a static magnetic field, comprising: collecting data corresponding to a magnetic resonance signal emitted from the subject; detecting a position of a particular section of the subject in the static magnetic field; reconstructing an image, based on the collected data, when the detected position falls within an allowable area; and controlling the movement unit to compensate for a deviation of the detected position from a reference position.

According to a fourth aspect of the present invention, there is provided a magnetic resonance imaging method comprising: collecting data corresponding to a magnetic resonance signal emitted from a subject placed in a static magnetic field; detecting a position of a particular section of the subject in the static magnetic field; setting an allowable area in accordance with a range of variations in the position detected within a unit period; and reconstructing an image based on the collected data, if the collected data is collected when the detected position falls within the allowable area.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2 is a view illustrating an example of a pulse sequence;

FIG. 3 is a view illustrating a target section for collecting movement detection data;

DETAILED DESCRIPTION OF THE INVENTION

An embodiment will be described with reference to the accompanying drawings.

Figure 1:
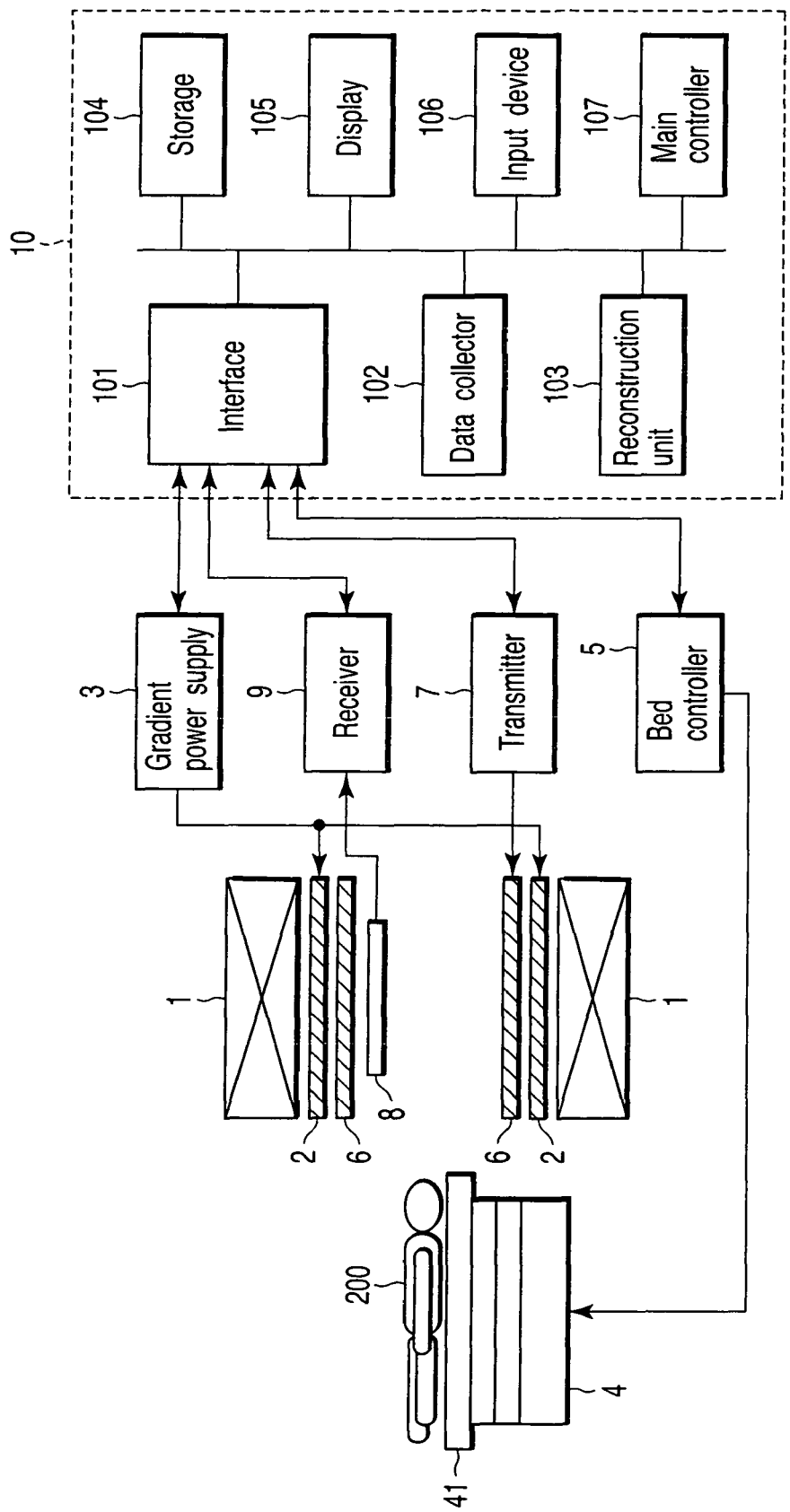
FIG. 1 is a block diagram illustrating a magnetic resonance imaging apparatus according to an embodiment.

FIG. 1 shows an MRI apparatus according to the embodiment. As shown, the MRI apparatus comprises a static field magnet 1, gradient coil 2, gradient power supply 3, bed 4, bed controller 5, transmission RF coil 6, transmitter 7, receiving RF coil 8, receiver 9 and computer system 10.

The static field magnet 1 is a hollow cylinder and generates a uniform static magnetic field in its internal space. The static field magnet 1 is formed of, for example, a permanent magnet or superconductive magnet.

The gradient coil 2 is also a hollow cylinder and is provided inside the static field magnet 1. The gradient coil 2 is formed of three coils perpendicular to each other and corresponding to the X-, Y- and Z-axes. In the gradient coil 2, the three coils are supplied with a current from the gradient power supply 3 to generate gradient magnetic fields having their respective magnetic field intensities varying along the X-, Y- and Z-axes. Assume here that the Z-axis is identical to, for example, the direction of magnetism of the static magnetic field. The gradient magnetic fields along the X-, Y- and Z-axes are arbitrarily used as, for example, a gradient magnetic field Gs for slice selection, a gradient magnetic field Ge for phase encoding, and a gradient magnetic field Gr for reading, respectively. The gradient magnetic field Gs for slice selection is arbitrarily used to determine an imaging section. The gradient magnetic field Ge for phase encoding is used to change the phase of a magnetic resonance signal in accordance with a spatial position. The gradient magnetic field Gr for readout is used to change the frequency of a magnetic resonance signal in accordance with a spatial position.

A subject 200 is placed on the top board 41 of the bed 4, and inserted into the cavity of the gradient coil 2 along with the top board 41. The top board 41 of the bed 4 is driven by the bed controller 5 to move longitudinally and vertically. In general, the bed 4 is set so that the longitudinal axis is the same as the axis of the static field magnet 1.

The transmission RF coil 6 is located inside the gradient coil 2. The transmission RF coil 6 is supplied with a high-frequency pulse signal from the transmitter 7, thereby generating a high-frequency magnetic field.

The transmitter 7 contains an oscillator, amplitude modulator, high-frequency power amplifier, etc. The oscillator generates a high-frequency signal of a resonant frequency unique to target atomic nuclei in a static magnetic field. The amplitude modulator modulates the amplitude of the high-frequency signal, output from the oscillator, in accordance with, for example, a sync function. The high-frequency power amplifier amplifies the high-frequency signal from the amplitude modulator. As a result of these processes, the transmitter 7 transmits, to the transmission RF coil 6, a high-frequency pulse signal corresponding to a Larmor frequency.

The receiving RF coil 8 is located inside the gradient coil 2. The receiving RF coil 8 receives a magnetic resonance signal emitted from a subject under the high-frequency magnetic field. The output of the receiving RF coil 8 is input to the receiver 9.

The receiver 9 generates magnetic resonance signal data based on the output of the receiving RF coil 8.

The computer system 10 includes an interface 101, data collector 102, reconstruction unit 103, storage 104, display 105, input device 106 and main controller 107.

The interface 101 is connected to the gradient power supply 3, bed controller 5, transmitter 7, receiving RF coil 8 and receiver 9, and transmits/receives a signal to/from them.

The data collector 102 collects, via the interface 101, digital signals output from the receiver 9. The data collector 102 stores, in the storage 104, the collected digital signals, i.e., magnetic resonance signal data.

The reconstruction unit 103 executes post-processing, i.e., reconstruction processing such as Fourier transform, on the magnetic resonance signal data stored in the storage 104, thereby acquiring spectrum data of desired nuclear spins or image data in the subject 200.

The storage 104 stores the magnetic resonance signal data, and the spectrum data or image data in units of subjects.

The display 105 displays various information items, such as spectrum data or image data, under the control of the main controller 107. The display 107 may be formed of, for example, a liquid crystal display.

The input device 106 receives various commands or information items from an operator. The input device 106 may be formed of a pointing device such as a mouse or track ball, a selection device such as mode switches, or an input device such as a keyboard.

The main controller 107 incorporates a CPU or memory (not shown), and controls the entire MRI apparatus of the embodiment. As well as a control function of realizing known standard operations performed in MRI apparatuses, the main controller 107 has a function of performing operations, described later, to compensate for the movement of the subject 200 and maintain the relationship between the position of slicing and the position of a target section substantially constant.

The operation of the MRI apparatus constructed as above will now be described. In particular, a description will be given of the case of imaging a coronary artery, utilizing a real-time movement compensation method in which changes in the position of the heart caused by breathing of the subject 200 are estimated from the movement of the diaphragm, and compensated.

FIG. 2 shows an example of a pulse sequence.

When imaging a coronary artery, the main controller 107 causes the data collector 102 to collect data for image reconstruction during a period PC corresponding to diastole. During a period PB preceding period PC, the main controller 107 causes the transmitter 7 to perform excitation for fat-water separation. Further, during a period PA preceding period PB, the main controller 107 causes the data collector 102 to collect data for movement detection. The above-mentioned periods can be determined in synchronism with the R wave of an electrocardiogram signal acquired by an electrocardiograph (not shown).

Figure 4:
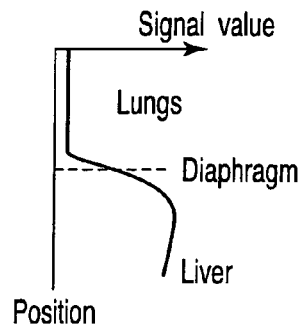
FIG. 4 is a view illustrating an example of data acquired by Fourier-transforming movement detection data.

Assume here that a data collection target region for reconstruction is, for example, the region indicated by A1 in FIG. 3, which includes the heart as the target section. Further, assume that a data collection target region for movement detection is the region indicated by A2 in FIG. 3, which is positioned near the boundary between the liver and lungs. When collecting movement detection data, a gradient pulse signal for reading is applied to the subject along the axis of the body (i.e., in the Z-axis direction in FIG. 3). When the thus-collected movement detection data is subjected to Fourier transform, data as shown in FIG. 4 can be acquired. Based on the data shown in FIG. 4, the main controller 107 detects the position of the diaphragm as the position of the boundary between the liver and lungs.

Figure 5:
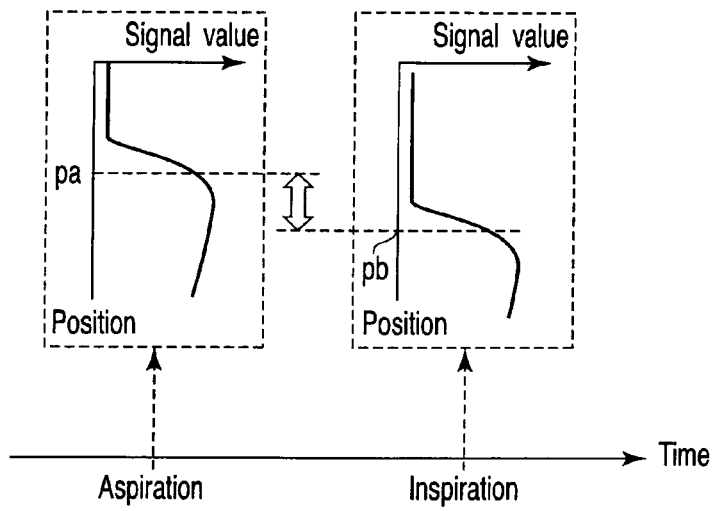
FIG. 5 is a view illustrating examples of data acquired by Fourier-transforming movement detection data, along with changes in the position of the diaphragm caused by breathing.

In the short term, the position of the diaphragm shifts between a position pa corresponding to exhalation, and a position pb corresponding to inhalation as shown in FIG. 5. In light of this, the main controller 107 uses, for example, the exhalation position pa as a reference position, and detects a deviation of the detected diaphragm position from the reference position. If the deviation falls within a preset allowable range (of, for example, 2.5 mm or less), the main controller 107 employs, as raw data for reconstruction, the data collected during the period PC immediate after the deviation is detected. If the deviation falls outside the preset allowable area, the main controller 107 inhibits the data collector 102 from collecting data immediately after the deviation is detected, or does not employ the collected data as raw data for reconstruction.

Figure 6:
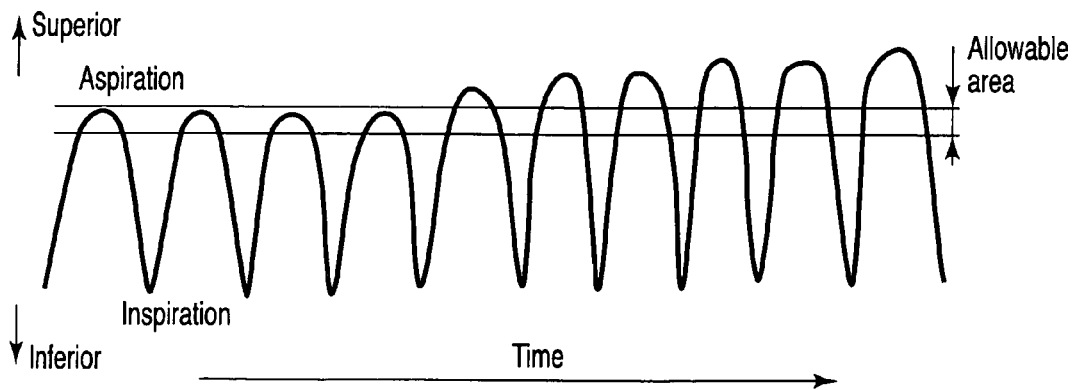
FIG. 6 is a view illustrating, with lapse of time, data acquired by Fourier-transforming movement detection data.

During imaging, the state of breathing of the subject 200, i.e., the depth of breathing, changes over a long period. FIG. 6 shows such changes. Specifically, FIG. 6 shows the relationship between the time and the data acquired by Fourier-transforming movement detection data. In the earlier half of FIG. 6, the position of the diaphragm during exhalation falls within an allowable area. However, in the later half of FIG. 6, the position of the diaphragm during exhalation gradually shifts toward the head and falls outside the allowable area. Suppose that at the beginning of imaging, the positional relationship between the heart and the center of the static magnetic field is like that assumed at time T1 in FIG. 7A. In this state, if the above-mentioned phenomenon occurs, the positional relationship shifts to, for example, that assumed at time T2 in FIG. 7A, because, for example, the depth of breathing of the subject 200 has changed since they have fallen asleep.

To compensate the change in the position of the heart, the main controller 107 always computes the rate of employment of reconstruction data collected within the latest preset period. For instance, it computes the rate of employment, as raw data for reconstruction, of the data acquired by a preset number (e.g., 50) of preceding data collections.

Figures 7A, 7B:
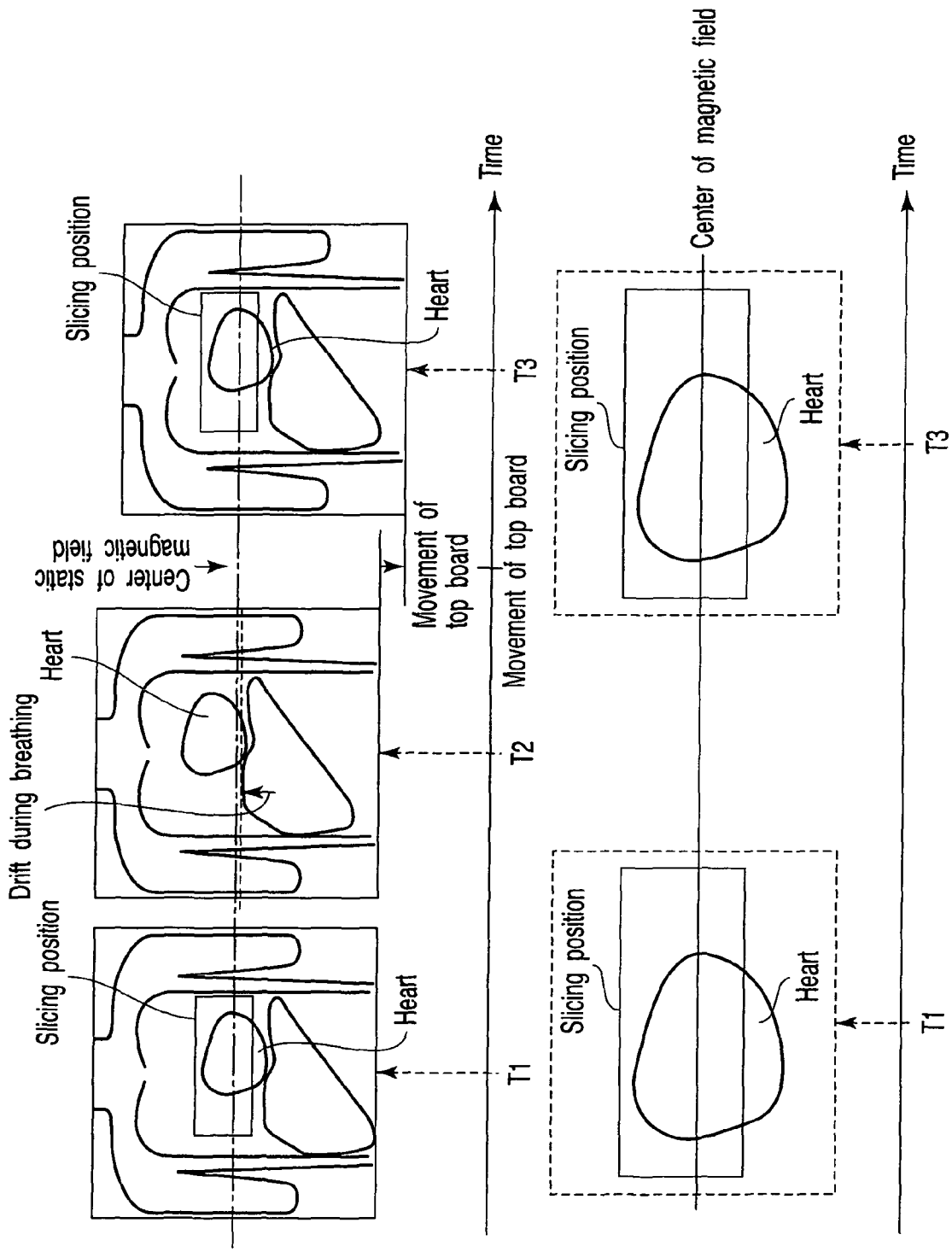
FIGS. 7A and 7B are views showing a state in which a top board is moved for compensating a change in the position of the heart.

If the computed data employment rate is not more than a preset value (e.g., 50%), the main controller 107 instructs the bed controller 5 to move the top board 41 to shift the positional relationship between the heart and the center of the static magnetic field to that assumed at time T3 in FIG. 7A, in order to return the positional relationship to that assumed at time T1 in FIG. 7A. The degree of movement and direction of the top board 41 are determined based on, for example, the average of deviations, from a reference position, of the positions collected in the latest preset period. It is desirable to move the top board 41 at a time at which no data collection is performed. However, the top board 41 may be moved regardless of whether data collection is performed, and the data collected while the top board 41 is moved may be determined invalid.

Thus, the relationship between the heart, the center of the static magnetic field and the slicing position can be kept substantially unchanged at times T1 and T3, as shown in FIG. 7B. As a result, even if an imaging method sensitive to static magnetic field uniformity is employed, high-quality imaging can be realized.

The main controller 107 may compute, from the movement detection data, the average of the positions of the diaphragm acquired in the latest preset number of times of movement detection, and may move the top board 41 if a deviation of the average position from the center of a preset allowable area exceeds a preset value. Alternatively, the main controller 107 may always display movement detection data on the display 105, and permit an operator to judge whether the top board 41 should be moved. In this case, the main controller 107 waits for the operator to issue an instruction to move the top board 41, using the input device 106, and moves the top board 41 in accordance with the instruction.

The above-described operation is an operation for compensating for a change in the breathing state of the subject 200 during a relatively long period. However, the breathing state of the subject 200 may change in a relatively short period. Since this change is caused by an increase in the range of variations of the diaphragm during aspiration and inhalation, the imaging period may well be extended although the possibility of the imaging process not being finished is small.

In light of this, the main controller 107 computes, from the movement detection data, a variance in the position of the diaphragm acquired in the latest preset number of times of movement detection, and modifies the allowable area in accordance with the variance.

Figure 8:
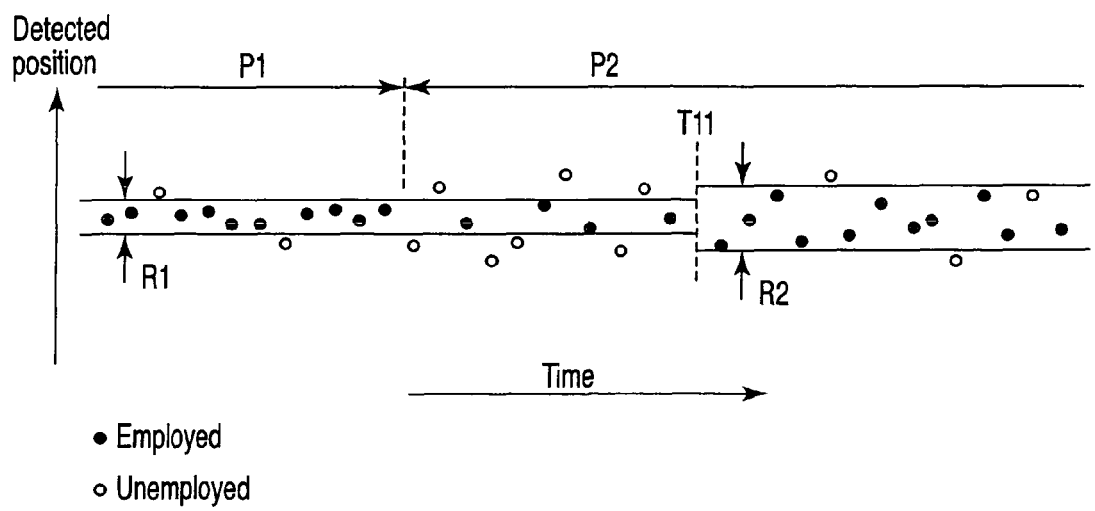
FIG. 8 is a view illustrating a change in an allowance range for covering a change in the degree of stability of breathing.

For instance, during the period P1 in FIG. 8, breathing is relatively stable, and the variance in the position of the diaphragm is small. In contrast, the variance during the period P2 is greater than that during the period P1. In this case, the main controller 107 varies the allowable area from R1 to R2 (which is greater than R1) at time T11 at which it detects that the variance is greater that before. As a result, efficient data collection is enhanced and hence extension of the imaging period can be avoided.

When breathing is stabilized, it is desirable to narrow the allowable area to thereby secure high image quality. Therefore, if breathing is temporarily unstable and then restored to its original stable state and hence the variance is also restored, it is preferable that the main controller 107 narrow the allowable area.

Figure 9A:
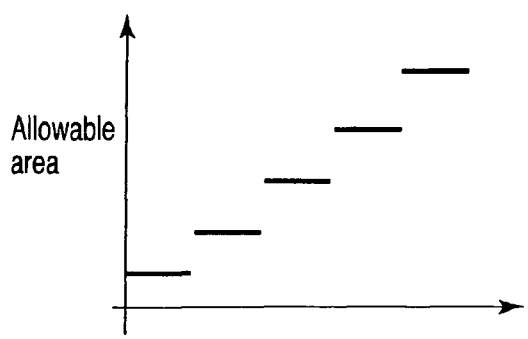
FIGS. 9A and 9B are graphs showing setting examples concerning the relationship between the positions of the diaphragm and the allowance range.
Figure 9B:
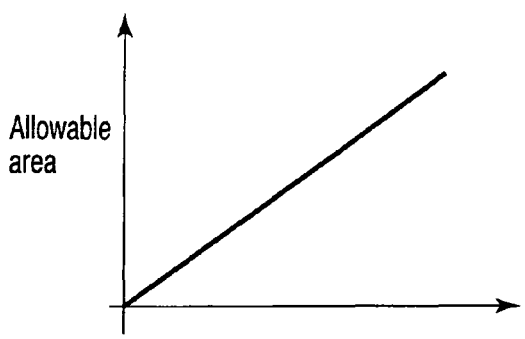
Figure 10:
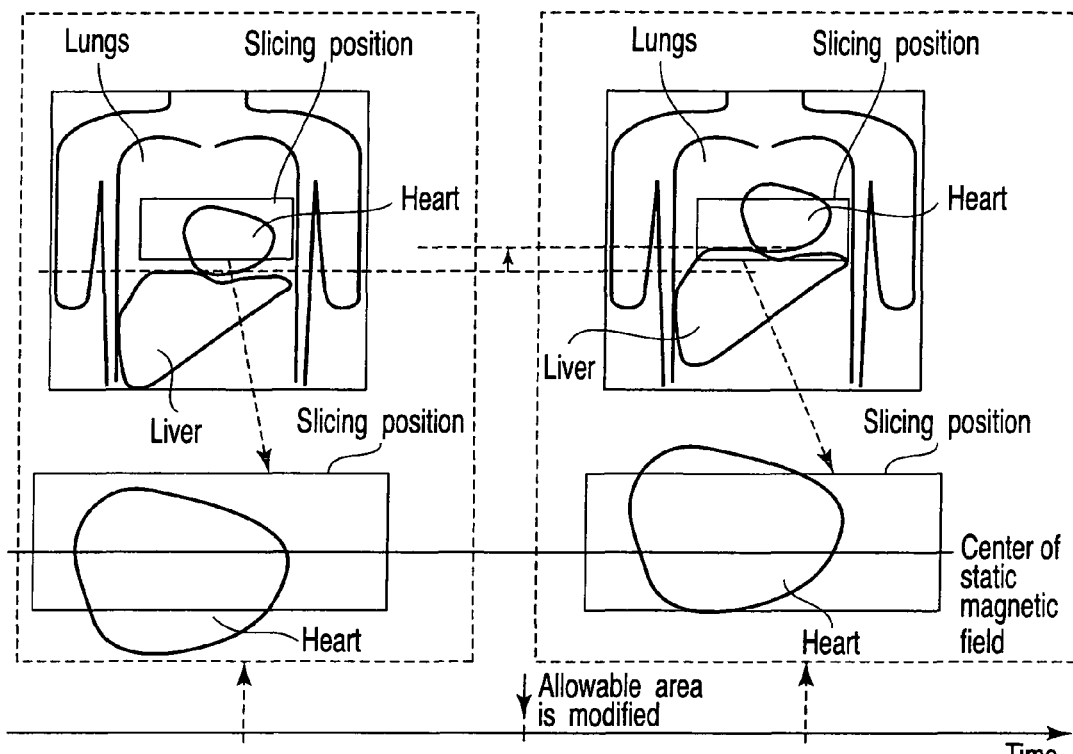
FIG. 10 is a view showing a state in which the position of a target section is deviated from a slicing position before and after the correction of an allowance range in a conventional movement compensation method.
Figure 11:
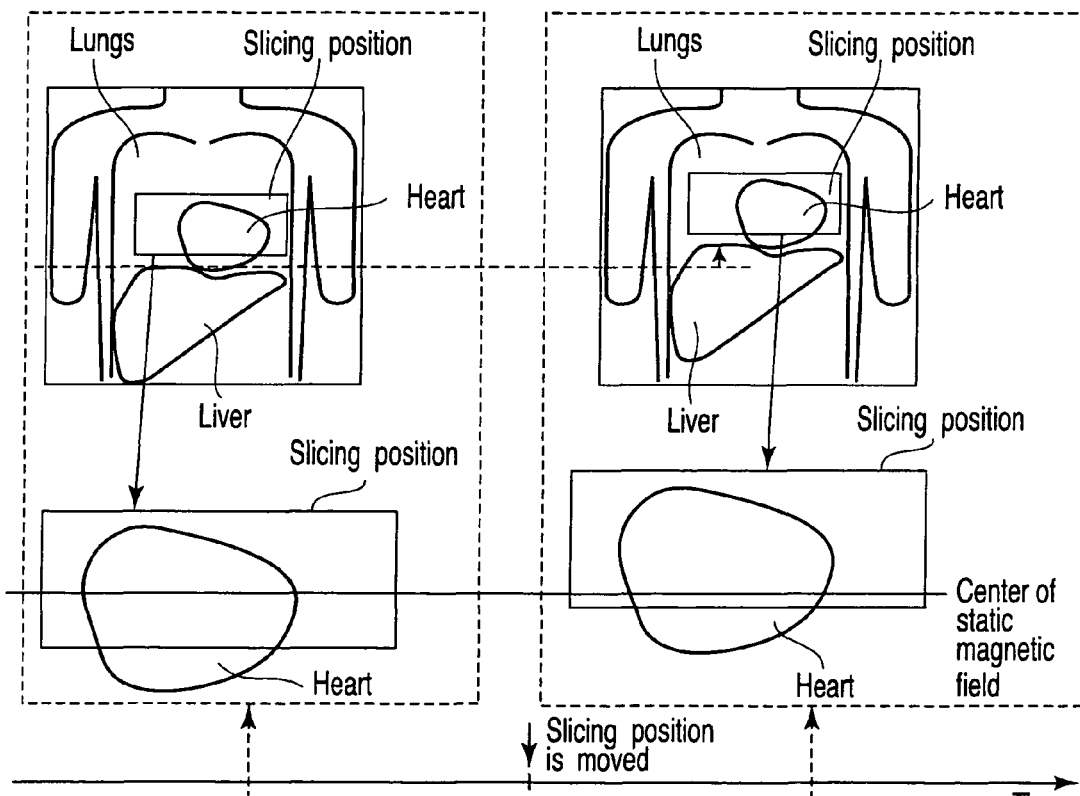
FIG. 11 is a view showing a state in which the slicing position is shifted along the Z-axis in the conventional movement compensation method.

The relationship between the variance in the position of the diaphragm and the allowable area is preset. For instance, the relationship may be set in discrete stages as shown in FIG. 9A. Alternatively, the relationship may be varied gradually as shown in FIG. 9B. Further, the probability concerning data employment, for example, may be used as a parameter for estimating the allowable area.

The above embodiment may be modified in various ways:

For instance, the position of a section other than the diaphragm may be detected. The axial movement of the abdominal section, for example, may be detected.

The target section is not limited to the heart.

Only movement control of the top board 41 or change of the allowable area may be executed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
   a movement unit which moves a subject placed in a static magnetic field;
   a collector which collects data corresponding to a magnetic resonance signal emitted from the subject;
   a detector which detects a position of a particular section of the subject in the static magnetic field;
   a reconstruction unit which reconstructs an image, based on the collected data, when the detected position falls within an allowable area; and
   a controller which controls the movement unit to compensate for a deviation of the detected position from a reference position.

2. The magnetic resonance imaging apparatus according to claim 1, wherein:
   the collector also collects position detection data corresponding to another magnetic resonance signal emitted from a periphery of the particular section; and
   the detector detects the position of the particular section based on the position detection data.

3. The magnetic resonance imaging apparatus according to claim 1, wherein:
   the collector collects the data periodically;
   the detector detects the position of the particular section before the collector collects the data; and
   the reconstruction unit employs part of the data collected by the collector when reconstructing the image, the part being collected immediately after the position of the particular section is detected in the allowable area.

4. The magnetic resonance imaging apparatus according to claim 3, wherein the controller controls the movement unit to compensate for the deviation when a rate of employment of the data by the reconstruction unit is not more than a preset value.

5. The magnetic resonance imaging apparatus according to claim 1, further comprising a unit which provides a user with information indicating the deviation, and wherein the controller controls the movement unit to compensate for the deviation in accordance with an instruction from the user.

6. The magnetic resonance imaging apparatus according to claim 1, wherein the controller moves the movement unit when the collector does not perform data collection.

7. A magnetic resonance imaging method for use in a magnetic resonance imaging apparatus with a movement unit for moving a subject placed in a static magnetic field, comprising:
   collecting data corresponding to a magnetic resonance signal emitted from the subject;
   detecting a position of a particular section of the subject in the static magnetic field;
   reconstructing an image, based on the collected data, when the detected position falls within an allowable area; and
   controlling the movement unit to compensate for a deviation of the detected position from a reference position.

* * * * *